United States Patent
Lee et al.

(10) Patent No.: US 7,260,374 B2
(45) Date of Patent: Aug. 21, 2007

(54) METHOD FOR CONTROLLING POWER LEVEL OF RECEIVED SIGNAL IN ULTRA WIDE BAND TRANSMISSION SYSTEM

(75) Inventors: Hyung-Soo Lee, Daejon (KR); Sang-In Cho, Daejon (KR); Kyu-Min Kang, Daejon (KR); Chang-Joo Kim, Daejon (KR)

(73) Assignee: Electronics and Telecommunications Research Institute (KR)

( * ) Notice: Subject to any disclaimer, the term of this patent is extended or adjusted under 35 U.S.C. 154(b) by 512 days.

(21) Appl. No.: 10/841,591

(22) Filed: May 6, 2004

(65) Prior Publication Data

US 2005/0009490 A1 Jan. 13, 2005

(30) Foreign Application Priority Data

Oct. 7, 2003 (KR) .................. 10-2003-0069490

(51) Int. Cl.
*H04B 1/06* (2006.01)
(52) U.S. Cl. .............. 455/234.1; 455/232.1; 455/240.1
(58) Field of Classification Search ......... 455/234.1, 455/232.1, 240.1, 234.2, 249.1, 239.1, 242.1, 455/242.2, 243.1, 245.2, 250.1, 241.1, 253.1, 455/253.2
See application file for complete search history.

(56) References Cited

U.S. PATENT DOCUMENTS

| | | | |
|---|---|---|---|
| 5,483,691 A * | 1/1996 | Heck et al. ............ | 455/234.2 |
| 5,507,023 A * | 4/1996 | Suganuma et al. ...... | 455/234.1 |
| 5,745,847 A * | 4/1998 | Matsuo .................... | 455/234.1 |
| 5,907,798 A * | 5/1999 | Abramsky et al. ....... | 455/249.1 |
| 6,075,995 A | 6/2000 | Jensen | |
| 6,498,926 B1 * | 12/2002 | Ciccarelli et al. ........ | 455/240.1 |
| 7,099,641 B2 * | 8/2006 | Bruckmann et al. ..... | 455/232.1 |

FOREIGN PATENT DOCUMENTS

| | | |
|---|---|---|
| KR | 010039194 | 5/2001 |
| KR | 010066459 | 7/2001 |

OTHER PUBLICATIONS

Electronics Letters, Feb. 5, 1998, vol. 34, No. 3, pp. 238-240.

\* cited by examiner

*Primary Examiner*—Lana Le
(74) *Attorney, Agent, or Firm*—Blakely Sokoloff Taylor & Zafman

(57) ABSTRACT

Disclosed is a method for controlling power level of received signal in an ultra wide band transmission system which uses multi frequency bands, and includes a pre-gain controller (PGC) and a voltage gain amplifier (VGA). The method for controlling a power level of a received signal includes the steps of: a) at the PGCs, detecting which multi frequency band is used in a transmitter of the transmission system; b) at the PGCs, obtaining the voltage gain owing to the discrepancy in the power levels of the received signals; and c) at the PGCs, compensating for the power loss based on the voltage gain.

3 Claims, 6 Drawing Sheets

METHOD FOR CONTROLLING POWER LEVEL OF RECEIVED SIGNAL IN ULTRA WIDE BAND TRANSMISSION SYSTEM

FIELD OF THE INVENTION

The present invention relates to a method for controlling a power level of a received signal in a ultra wide-band (UWB) transmission system and a computer-readable recording medium for recording a program that implements the same method; and, more particularly, to a method for restoring a power level of a received signal to compensate for the signal power loss in an ultra wide-band (UWB) transmission system in which multi frequency bands are in use, and a computer-readable recording medium for recording a program that implements the same method.

DESCRIPTION OF RELATED ART

In general, when a radio wave signal is transmitted from one point (source) to another point (target) in a free space, power levels of the received radio wave signals are different depending on the distance between the two points. In the free space, the electric field intensity (E) of the radio wave signal, which is radiated by an isotropic antenna as a transmission power $P_t$ [Watts] and received at a point that is d meters away from the source, is defined as $$E = \frac{\sqrt{30 P_t}}{d}$$

(in V/m). Here, d is longer than the wavelength of the radio wave signal, and the received power at this point is defined as $$P_{watt} = \frac{E^2}{120\pi} \frac{\lambda^2}{4\pi} \ [W].$$

The degree to which the radio wave signal is attenuated can be obtained using the above-mentioned equations. Here, the signal attenuation caused by the signal energy decrease that takes place as the signal spreads over larger areas at increased distances from the source is referred to as the free space loss (FSL). The FSL is used as a reference by which the signal energy decrease is measured.

The FSL is expressed by an equation as:

$$FSL = 92.4 + 20 \log f + 20 \log d \quad \text{Eq. (1)}$$

where f is a frequency in use, measured in GHz, and d is the distance between the source and a point at which the measurement is taking place, measured in kilometer (km).

FIG. 1 is a graph showing frequency bands for use in an M-band transmission system.

As shown, frequency bands can have the same bandwidth or different bandwidths to each other, and a guard band may exist between adjacent frequency bands.

In an M-band transmission system which uses M frequency bands, if two transmission signals each having a different frequency band #i and #j ($i \neq j$, $I, j = 1, 2, \ldots, M$) are transmitted and fed into the same receiver, the power levels of the received signals are significantly different according to the frequency band of the transmission signal.

In a conventional transmission system which uses multi frequency bands, a voltage gain amplifier (VGA) controls the power level of a received signal to compensate for the signal power loss.

However, the one major drawback of compensating the signal power loss in the conventional transmission system is in that a VGA should be designed to have the dynamic range on the order of the tens dB. In this case, the initial convergence rate is slowed down. Another drawback of compensating the signal power loss in the conventional transmission system is in that a VGA should be designed for each frequency band. In this case, the transmission system is complex.

SUMMARY OF THE INVENTION

It is, therefore, an object of the present invention to provide a method for controlling the power level of a received signal in a ultra wide-band (UWB) transmission system.

In accordance with an aspect of the present invention, there is provided a method for controlling a power level of a received signal in an ultra wide-band transmission system which uses multi frequency bands, and includes a pre-gain controller (PGC) and a voltage gain amplifier (VGA), the method including the steps of: a) at the PGCs, detecting which multi frequency band is used in a transmitter of the transmission system; b) at the PGCs, obtaining the voltage gain owing to the discrepancy in the power levels of the received signals; and c) at the PGCs, compensating for the power loss based on the voltage gain.

In accordance with another aspect of the present invention, there is provided an apparatus for controlling a power level of a received signal in an ultra wide-band transmission system which uses multi frequency bands, and includes a pre-gain controller (PGC) and a voltage gain amplifier (VGA), the apparatus including: a unit for detecting which multi frequency band is used in a transmitter of the transmission system; a unit for obtaining the voltage gain owing to the discrepancy in the power levels of the received signals; and a unit for compensating for the power loss based on the voltage gain.

In accordance with still another aspect of the present invention, there is provided a computer readable recording media storing instructions executing a method for controlling a power level of a received signal to compensate for the signal power loss in an ultra wide-band transmission system, the method including the steps of: a) at the PGCs, detecting which multi frequency band is used in a transmitter of the transmission system; b) at the PGCs, obtaining the voltage gain owing to the discrepancy in the power levels of the received signals; and c) at the PGCs, compensating for the power loss based on the voltage gain.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

Other objects and aspects of the invention will become apparent from the following description of the embodiments with reference to the accompanying drawings, which is set forth hereinafter.

Figure 2:
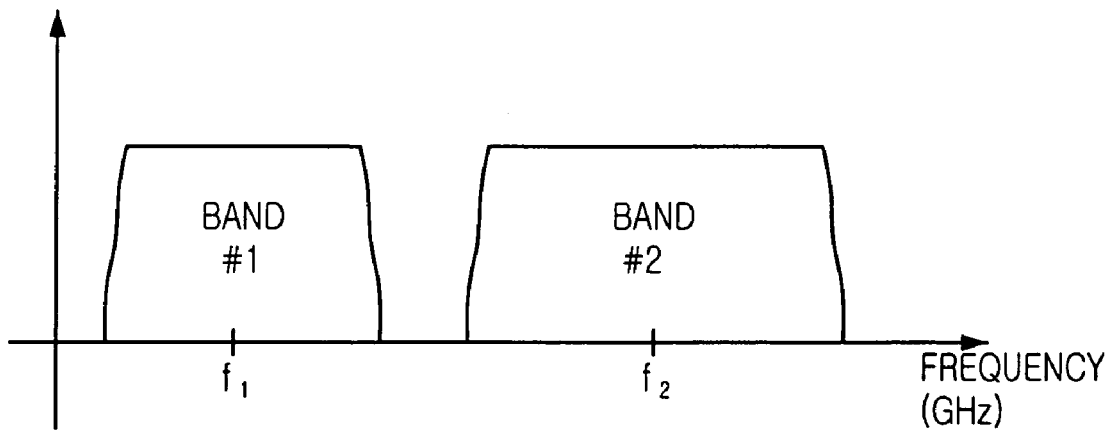
FIG. 2 is a graph showing frequency bands for use in a two (2) band transmission system.

FIG. 2 is a graph showing frequency bands for use in a 2-band transmission system. In the 2-band transmission system wherein the minimum and maximum frequency bands are in use, the power level of one received signal is at least twice as big as that of the other received signal. The 2-band transmission system includes all such transmission systems using more than one frequency band.

Figure 3:
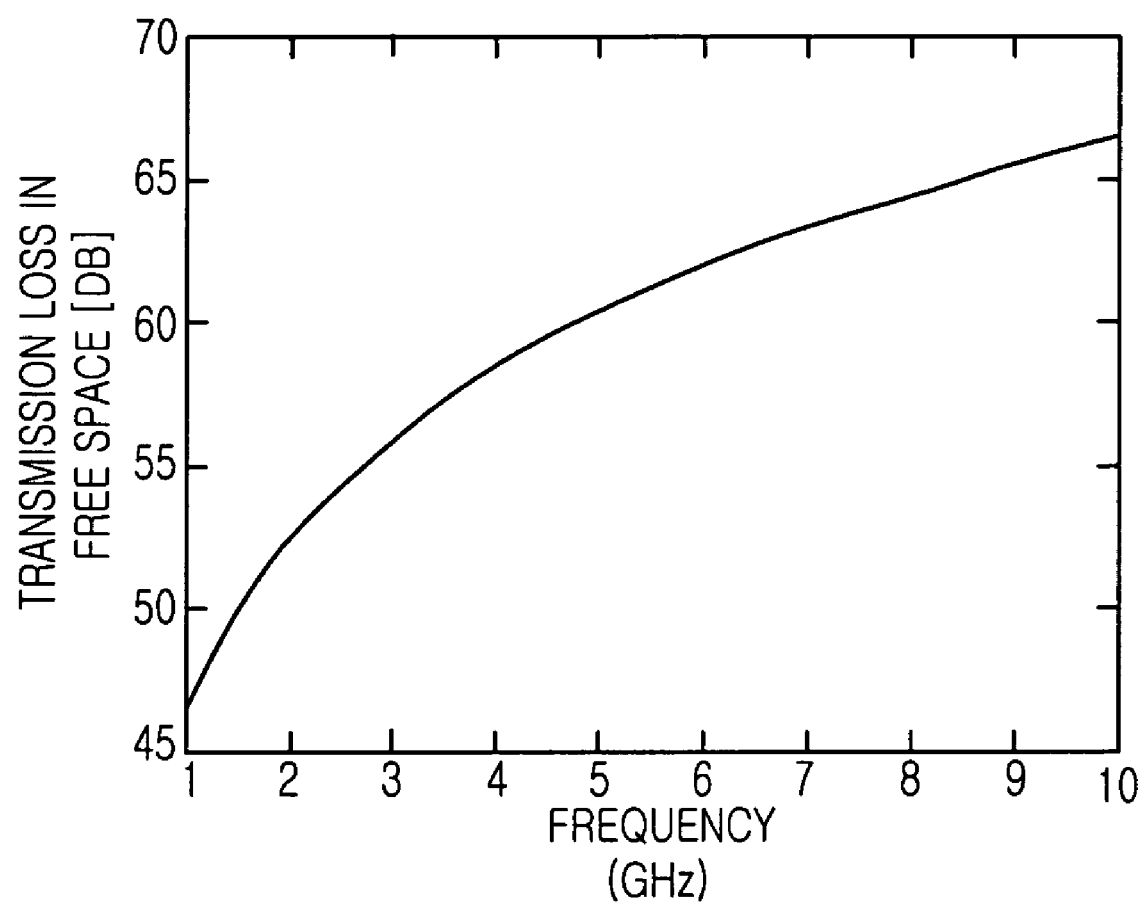
FIG. 3 is a graph describing the free space loss (FSL) of the transmission signal.

FIG. 3 is a graph describing the free space loss (FSL) of transmission signal which can be obtained by Eq. (1).

As shown, each point on the horizontal axis represents frequency measured in GHz and each point on the vertical axis represents the amount of the FSL measured in dB.

Figure 4A:
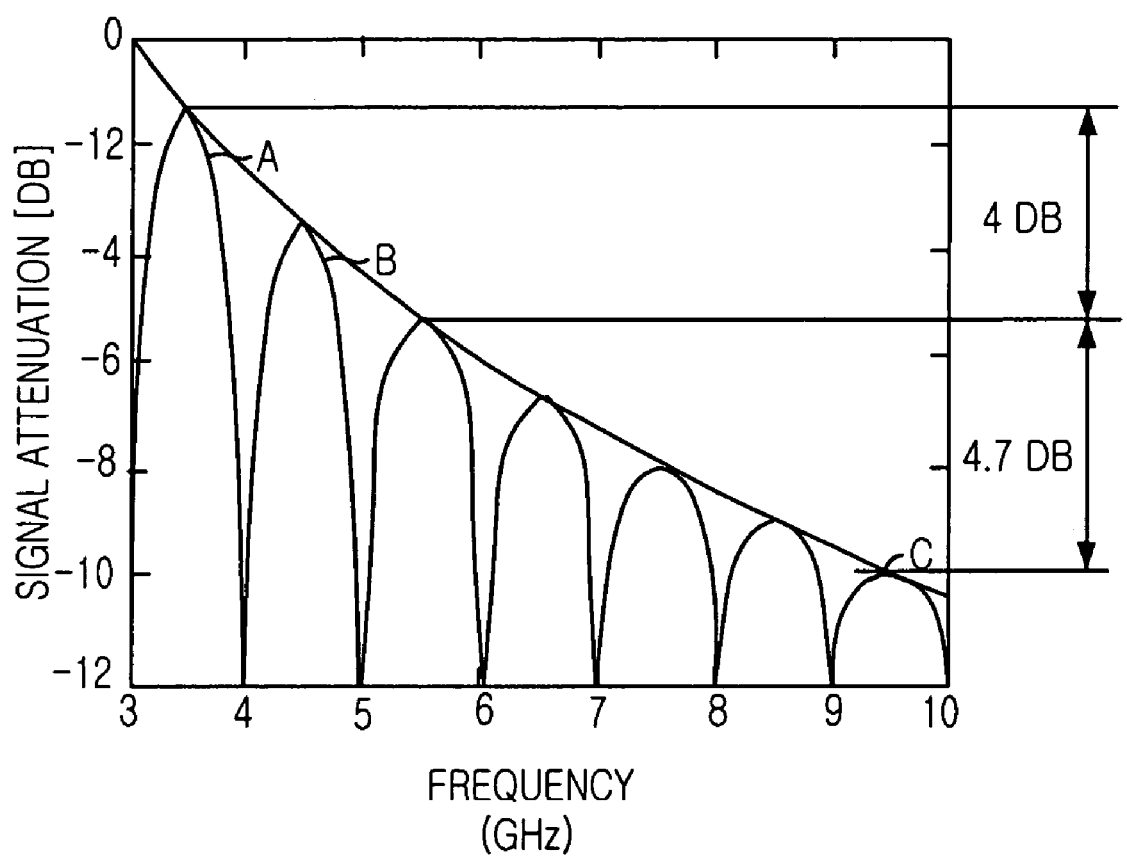
FIG. 4A is a graph describing the signal attenuation due to the FSL on each frequency band in a conventional transmission system in which seven (7) frequency bands are in use.
Figure 4B:
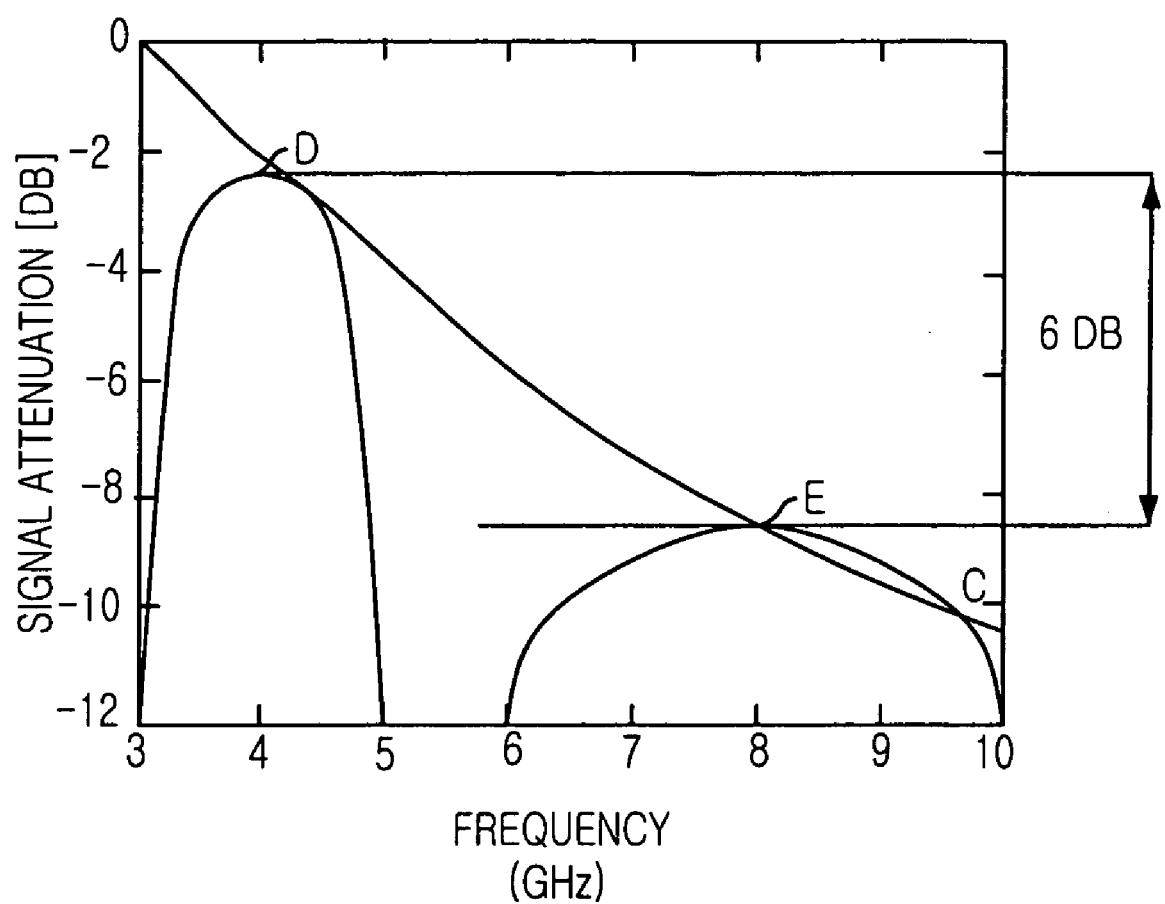
FIG. 4B is a graph showing the signal attenuation due to the FSL on each frequency band in a conventional transmission system in which two (2) frequency bands are in use.

FIG. 4A is a graph describing the signal attenuation in the FSL on each frequency band in a conventional transmission system which uses seven (7) frequency bands. FIG. 4B is a graph showing the signal attenuation in the FSL on each frequency band in a conventional transmission system which uses two (2) frequency bands.

Referring to FIG. 4A, a signal labeled 'A' has a center frequency of 3.5 GHz; a signal labeled 'B', 5.5 GHz; and a signal labeled 'C', 9.5 GHz. Roughly speaking, the power level of the signal 'A' is 4 dB higher than that of the signal 'B', and is, in turn, 8.7 dB higher than that of the signal 'C'.

Referring to FIG. 4B, a signal labeled 'D' has a center frequency of 4 GHz and a signal labeled 'E' has a center frequency of 8 GHz. The power level of the signal 'D' is about 6 dB higher than that of the signal 'E'.

Figure 5A:
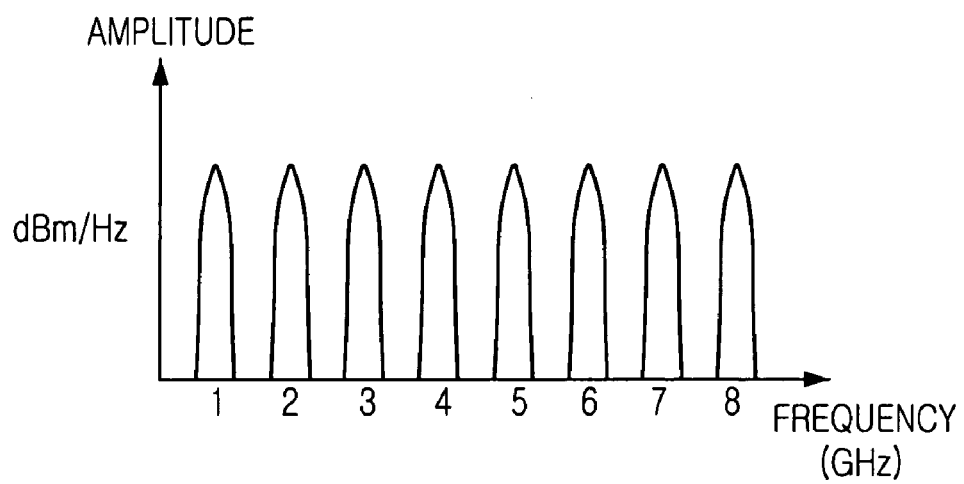
FIG. 5A is a graph showing a power spectrum on each frequency band at an output end of a transmitter in the conventional transmission system.
Figure 5B:
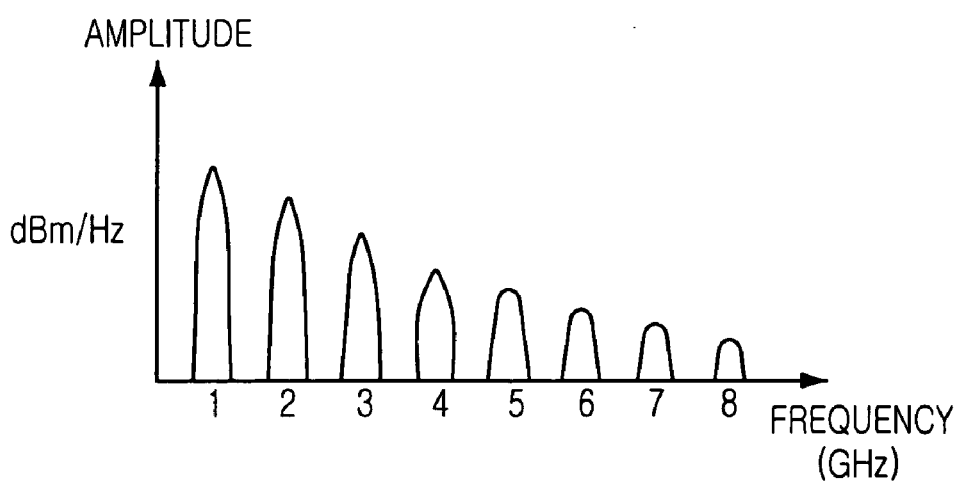
FIG. 5B is a graph showing a power spectrum on each frequency band at an input end of a receiver in the conventional transmission system.

FIG. 5A is a graph showing a power spectrum of transmission signals on each frequency band at the output end of a transmitter in a conventional transmission system. FIG. 5B is a graph showing a power spectrum of received signals on each frequency band at the input end of a receiver in a conventional transmission system.

Referring to FIG. 5A, the transmission signals on each frequency band are transmitted as the same power strength, which is defined in an international standard, at the output end of the transmitter. Referring to FIG. 5B, the power levels of the received signals at the input end of the receiver are different from each other dependent on the frequency band used for transmission.

In the present invention, which will be described with reference to FIG. 6, such discrepancy between the power level of the transmission signal and the power level of the received signal is compensated before the received signal is applied into a voltage gain amplifier (VGA).

Figure 6:
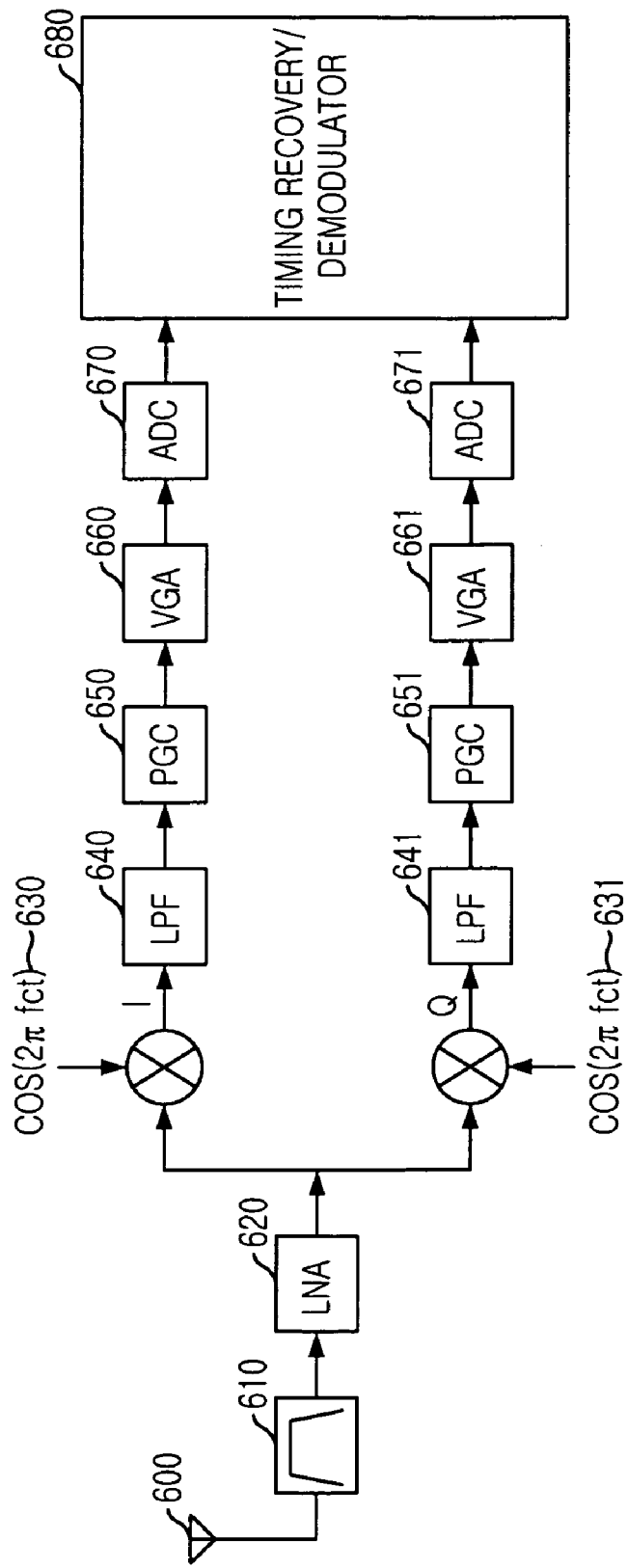
FIG. 6 is a diagram of a receiver in a transmission system in accordance with an embodiment of the present invention.

FIG. 6 is a diagram showing a receiver in a transmission system in accordance with an embodiment of the present invention.

As shown, the receiver in the transmission system includes an antenna 600, a pre-select filter 610, a low noise amplifier (LNA) 620, a modulator 630 and 631, a low pass filter (LPF) 640 and 641, a pre-gain controller (PGC) 650 and 651, a voltage gain amplifier (VGA) 660 and 661, an analog-to-digital converter (ADC) 670 and 671 and a timing recovery/demodulator 680.

The PGCs 650 and 651 precedes the VGAs 660 and 661 respectively in a working procedure. The use of PGCs 650 and 651 decreases complexity of the transmission system and increases the initial convergence rate.

The modulators 630 and 631 detect the frequency band which is used in the transmitter of the transmission system.

Referring to FIG. 1 again, the power spectrum of the received signal on the $i^{th}$ frequency band can be expressed as:

$$S_i(f)=P_i(f)|H_i(f)|^2, \quad i=1,2,\ldots,M \qquad \text{Eq. (2)}$$

where $P_i(f)$ is the power spectral density (PSD) on the $i^{th}$ frequency band and $H_i(f)$ is a channel transfer function on the $i^{th}$ frequency band.

The PGCs 650 and 651 compute a voltage gain owing to the discrepancy in the power levels of the received signals, and compensate the received signals for the power loss based on the voltage gain.

Figure 1:
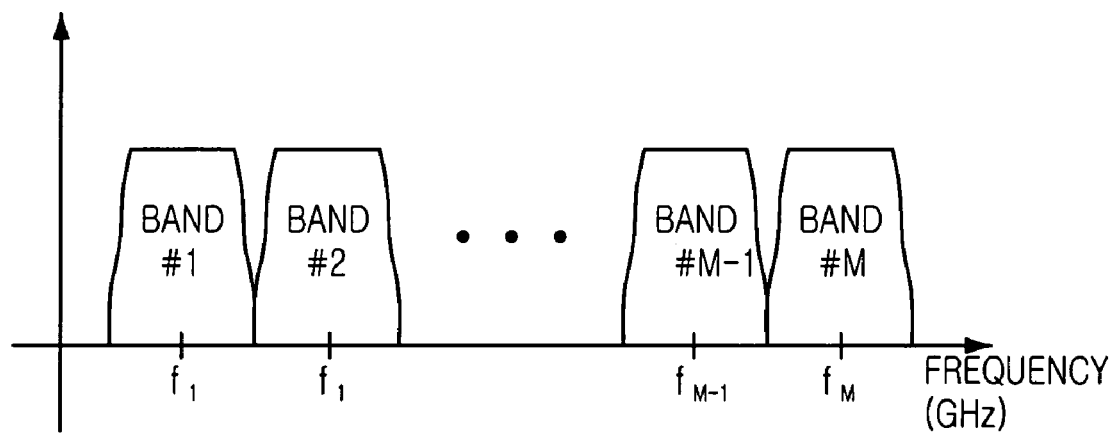
FIG. 1 is a graph showing frequency bands for use in an M-band transmission system.

Assuming that the $1^{st}$ frequency band (band #1) of FIG. 1 is used as a reference band, the voltage gain (G) acquired by the PGCs 650 and 651 of FIG. 6 can be expressed as:

$$G = \frac{\int_{B_1} P_1(f)|H_1(f)|^2 df}{\int_{B_i} P_i(f)|H_i(f)|^2 df} \qquad \text{Eq. (3)}$$

where $B_i$ stands for the $i^{th}$ frequency band in use for transmission; $P_i(f)$, the PSD on the $i^{th}$ frequency band; $H_i(f)$, a channel transfer function on the $i^{th}$ frequency band.

Based on the Eq. 3, the PGCs 650 and 651 compute the voltage gain caused by the discrepancy between the power levels of frequencies in use and compensate for the signal power loss, which makes the design of a transmission system easy and speeds up the initial convergence rate.

As described above, the power control method of the present invention can be embodied as a program and stored in a computer-readable recording medium, such as CD-ROM, RAM, ROM, floppy disks, hard disks, optical-magnetic disks and the like.

In a conventional transmission system which uses multi frequency bands, the function of a VGA is to restore the power level of a received signal to compensate for the signal power loss. In the present invention, however, the PGC performs restores the power level of the received signal and compensates for the signal power loss, to thereby make the VGA simple. Also, the dynamic range of the VGA is narrow, to thereby speed up the initial convergence rate. It will be appreciated that the present invention can be applied to various systems not just a wireless transmission system but also all systems which use multi frequency bands.

While the present invention has been described with respect to certain preferred embodiments, it will be apparent to those skilled in the art that various changes and modifications may be made without departing from the scope of the invention as defined in the following claims.

What is claimed is:

1. A method for controlling a power level of a received signal in an ultra wide-band transmission system which uses multi frequency bands, and includes a pre-gain controller (PGC) and a voltage gain amplifier (VGA), the method comprising the steps of:
   a) at the PGCs, detecting which multi frequency band is used in a transmitter of the transmission system;
   b) at the PGCs, obtaining the voltage gain owing to the discrepancy in the power levels of the received signals; and
   c) at the PGCs, compensating for the power loss based on the voltage gain, wherein the voltage gain (G) acquired by the PGCs is expressed as:

$$G = \frac{\int_{B_1} P_1(f)|H_1(f)|^2 df}{\int_{B_i} P_i(f)|H_i(f)|^2 df}$$

where $B_i$ denotes the $i^{th}$ frequency band in use for transmission; $P_i(f)$, the PSD on the $i^{th}$ frequency band; $H_i(f)$, a channel transfer function on the $i^{th}$ frequency band.

2. An apparatus for controlling a power level of a received signal in an ultra wide-band transmission system which uses multi frequency bands, and includes a pre-gain controller (PGC) and a voltage gain amplifier (VGA), the apparatus comprising:
   means for detecting which multi frequency band is used in a transmitter of the transmission system;
   means for obtaining the voltage gain owing to the discrepancy in the power levels of the received signals; and
   means for compensating for the power loss based on the voltage gain,
wherein the voltage gain (G) acquired by the PGCs is expressed as:

$$G = \frac{\int_{B_1} P_1(f)|H_1(f)|^2 df}{\int_{B_i} P_i(f)|H_i(f)|^2 df}$$

where $B_i$ denotes the $i^{th}$ frequency band in use for transmission; $P_i(f)$, the PSD on the $i^{th}$ frequency band; $H_i(f)$, a channel transfer function on the $i^{th}$ frequency band.

3. A computer readable recording media storing instructions executing a method for controlling a power level of a received signal to compensate for the signal power loss in an ultra wide-band transmission system, the method comprising the steps of:
   a) at the PGCs, detecting which multi frequency band is used in a transmitter of the transmission system;
   b) at the PGCs, obtaining the voltage gain owing to the discrepancy in the power levels of the received signals; and
   c) at the PGCs, compensating for the power loss based on the voltage gain, wherein the voltage gain (G) acquired by the PGCs is expressed as:

$$G = \frac{\int_{B_1} P_1(f)|H_1(f)|^2 df}{\int_{B_i} P_i(f)|H_i(f)|^2 df}$$

where $B_i$ denotes the $i^{th}$ frequency band in use for transmission; $P_i(f)$, the PSD on the $i^{th}$ frequency band; $H_i(f)$, a channel transfer function on the $i^{th}$ frequency band.

* * * * *